United States Patent
Yeom

(10) Patent No.: US 9,514,897 B2
(45) Date of Patent: Dec. 6, 2016

(54) MAGNETIC CONTACTOR

(71) Applicant: LSIS CO., LTD., Anyang-si, Gyeonggi-do (KR)

(72) Inventor: Jong Sung Yeom, Incheon (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/478,952

(22) Filed: Sep. 5, 2014

(65) Prior Publication Data
US 2015/0179359 A1    Jun. 25, 2015

(30) Foreign Application Priority Data
Dec. 19, 2013    (KR) .................... 10-2013-0159504

(51) Int. Cl.
| | |
|---|---|
| *H01H 67/02* | (2006.01) |
| *H01H 3/28* | (2006.01) |
| *H01H 47/10* | (2006.01) |
| *H01H 50/20* | (2006.01) |
| *H05K 1/18* | (2006.01) |

(Continued)

(52) U.S. Cl.
CPC ............... *H01H 3/28* (2013.01); *H01H 47/10* (2013.01); *H01H 50/20* (2013.01); *H05K 1/181* (2013.01); *H01H 50/041* (2013.01); *H01H 50/40* (2013.01); *H01H 50/443* (2013.01); *H01H 50/546* (2013.01); *H01H 50/58* (2013.01);

(Continued)

(58) Field of Classification Search
CPC .......... H01H 3/28; H01H 63/02; H01H 67/02; H01H 50/16; H01H 1/64
USPC ........................................... 335/107
See application file for complete search history.

(56) References Cited

U.S. PATENT DOCUMENTS 2,833,885 A * 5/1958 Wells ..................... H01H 50/56
                                                     200/1 R
3,215,800 A * 11/1965 Hurter ................ H01H 11/0012
                                                     200/280

(Continued)

FOREIGN PATENT DOCUMENTS

| CN | 102820173 | 12/2012 |
|---|---|---|
| CN | 104576220 | 4/2015 |

(Continued)

OTHER PUBLICATIONS

European Patent Office Application Serial No. 14183909.2, Search Report dated Apr. 14, 2015, 6 pages.

(Continued)

*Primary Examiner* — Shawki S Ismail
*Assistant Examiner* — Lisa Homza
(74) *Attorney, Agent, or Firm* — Lee Hong Degerman Kang & Waimey

(57) ABSTRACT

Disclosed is a magnetic contactor. The magnetic contactor includes a frame, a bobbin provided in the frame, and configured to include a hollow part, a movable core movably inserted into the hollow part in an axial direction, a yoke disposed at the outer surface of the bobbin to be separated from the coil and to face each other, and configured to act as a fixed core, and a manipulating circuit part disposed at the outer surface of the bobbin in parallel with a moving direction of the movable core to intersect the yoke. The coil is wound around an outer surface of the bobbin. Accordingly, a coil having a broad rated voltage range is used. Also, a structure of a product is simplified, and a space is broadly used.

13 Claims, 22 Drawing Sheets

(51) Int. Cl.
*H01H 50/40* (2006.01)
*H01H 50/44* (2006.01)
*H01H 50/54* (2006.01)
*H01H 50/58* (2006.01)
*H01H 50/04* (2006.01)

(52) U.S. Cl.
CPC .............. *H05K 2201/10015* (2013.01); *H05K 2201/10053* (2013.01)

(56) References Cited

U.S. PATENT DOCUMENTS

| | | | | |
|---|---|---|---|---|
| 4,883,997 | A * | 11/1989 | De Cesare | H02K 1/143 310/179 |
| 5,886,602 | A * | 3/1999 | Burel | H01H 1/2008 200/243 |
| 5,959,519 | A * | 9/1999 | Gobel | H01F 7/1615 335/132 |
| 6,236,293 | B1 * | 5/2001 | Forster | H01H 51/2209 335/132 |
| 6,472,963 | B1 * | 10/2002 | Liu | H01H 50/026 335/132 |
| 6,628,184 | B1 * | 9/2003 | Cassagrande | H01H 50/021 335/129 |
| 6,661,321 | B1 * | 12/2003 | Chuang | H01H 50/042 335/132 |
| 7,973,625 | B2 * | 7/2011 | Chandrappa | H01H 50/541 200/243 |

FOREIGN PATENT DOCUMENTS

| | | |
|---|---|---|
| CN | 104637732 | 5/2015 |
| DE | 19648053 | 3/1998 |
| EP | 0122291 | 10/1984 |
| EP | 1353348 | 10/2003 |
| EP | 2557583 | 2/2013 |
| FR | 2259429 | 8/1975 |
| JP | 61-93956 | 6/1986 |
| JP | 04-043524 | 2/1992 |
| JP | 08-077906 | 3/1996 |
| JP | 2005-235515 | 9/2005 |
| JP | 2007-018955 | 1/2007 |
| JP | 2007-173436 | 7/2007 |
| JP | 2011-044278 | 3/2011 |
| JP | 2012-199122 | 10/2012 |
| JP | 2012-243626 | 12/2012 |
| KR | 20-0263521 | 2/2002 |
| KR | 10-1163519 | 7/2012 |
| KR | 10-1214610 | 12/2012 |

OTHER PUBLICATIONS

Japan Patent Office Application Serial No. 2014-189696, Office Action dated Jul. 8, 2015, 4 pages.
Korean Intellectual Property Office Application Serial No. 10-2013-0159504, Notice of Allowance dated May 28, 2915, 2 pages.
European Patent Office Application Serial No. 14183909.2, Search Report dated Feb. 9, 2016, 8 pages.
The State Intellectual Property Office of the People's Republic of China Application Serial No. 201410782546.7, Office Action dated May 23, 2016, 12 pages.

* cited by examiner

MAGNETIC CONTACTOR

CROSS-REFERENCE TO RELATED APPLICATION

Pursuant to 35 U.S.C. §119(a), this application claims the benefit of earlier filing date and right of priority to Korean Application No. 10-2013-0159504, filed on Dec. 19, 2013, the contents of which are all hereby incorporated by reference herein in its entirety.

BACKGROUND OF THE DISCLOSURE

1. Field of the Disclosure

The present disclosure relates to a magnetic contactor that uses a coil having a broad rated voltage range and is compactly configured.

2. Background of the Disclosure

Generally, magnetic contactors are devices that switch power (a current) flowing in a main circuit by using the electromagnet principle. The magnetic contactors may be divided into, for example, medium•low-capacity products of less than 130 A and high-capacity products of 130 A to 800 A depending on a current capacity.

FIG. 1 is an exploded perspective view schematically illustrating a configuration of a general medium•low-capacity magnetic contactor. The magnetic contactor includes a first frame 11, a movable core 12, a backspring 13, a bobbin 14, a fixed core 15, and a second frame 16.

The bobbin 14 is a cylinder-shaped hollow iron core. When external power is applied to a coil 14a which is wound around an outer surface of the bobbin 14, a magnetic field is generated around the coil 14a, and the fixed core 15 having an E-shape is magnetized by the magnetic field to become an electromagnet.

The fixed core 15 changed to the electromagnet absorbs and downward attracts the movable core 12 of a conductor with a magnetic force, and a movable contact mechanically connected to the movable core 12 is lowered to contact a fixed contact. Therefore, a current flows in a main circuit.

At this time, when the power applied to the coil 14a dissipates, the magnetic field generated around the coil 14a is also released, and thus, the movable core 12 disposed on the backspring 13 is raised to the original position by an elastic restoring force of the backspring 13. Therefore, the movable contact is separated from the fixed contact, and thus, the current flowing in the main circuit is cut off.

In a prior art magnetic contactor, a rated voltage of a coil for operating a main contact (a movable contact and a fixed contact) is differently applied to products. For example, the rated voltage of the coil applied to the prior art magnetic is set to 24 V, 48 V, 100 V, 220 V, 240 V, 380 V, 440 V, 480 V, and 600 V. In each magnetic contactor, the rated voltage of the coil is marked on a manipulation coil terminal. That is, a coil applicable to each magnetic contactor is determined depending on the rated voltage of the coil.

According to the safety standard of the prior art magnetic contactor, in a first condition, in order to secure a reliability of a switch operation, although an external source voltage is within 85% to 110% of a rated voltage of a coil, when the rated voltage of the coil is, for example, 100 V, a fixed contact should operate as a movable contact even though only an external voltage of 85 V is applied to the coil. This is because a voltage of a power system is changed depending on a zone and a place in which a magnetic contactor is used.

In a second condition, even though an external source current applied to a coil is continued for a certain time (for example, two hours) or more, a temperature of the coil should not exceed a limited temperature (for example, 65 degrees C.).

The reason will now be described with reference to FIG. 2. FIG. 2 is a circuit diagram of a manipulation circuit part of a low-capacity magnetic contactor of the prior art. In the manipulation circuit part, since an external source voltage is applied to both ends of a coil L as-is, when an external source current is continuously applied to the coil L, a temperature of the coil L exceeds the limited temperature (for example, 65 degrees C.), and a resistance of the coil L increases. For this reason, a movable contact cannot operate.

In the prior art low-capacity magnetic contactor, when a voltage equal to 85% of a rated voltage of the coil L is applied to the coil L, the movable contact operates at an initial stage. However, since the external source current applied to the coil L is continued for a certain time or more, the coil L is deteriorated, and the resistance of the coil L increases. For this reason, it is unable to maintain a connection state of a contact.

Therefore, all the first and second conditions based on the safety standard should be satisfied.

Moreover, in the prior art magnetic contactor, the movable core 12 and the fixed core 15 have an E-shape, and thus, a space occupied in a frame is large. For this reason, there is limitations in simplifying a structure of a product and miniaturizing the product.

SUMMARY OF THE DISCLOSURE

Therefore, an aspect of the detailed description is to provide a magnetic contactor that satisfies all first and second conditions based on the existing coil safety standard, and moreover uses a coil having a broad rated voltage range.

Another aspect of the detailed description is to provide a magnetic contactor in which a structure of a product is simplified, and thus, the product can be miniaturized.

To achieve these and other advantages and in accordance with the purpose of this specification, as embodied and broadly described herein, a magnetic contactor includes a bobbin, a movable core, a yoke, and a manipulating circuit part.

The bobbin may be provided in the frame, and configured to include a hollow part, wherein a coil is wound around an outer surface of the bobbin.

The movable core may be movably inserted into the hollow part in an axial direction.

The yoke may be disposed at the outer surface of the bobbin to be separated from the coil and to face each other, and configured to act as a fixed core.

The manipulating circuit part may be disposed at the outer surface of the bobbin in parallel with a moving direction of the movable core to intersect the yoke.

According to the above-described embodiment of the present invention, the movable core has a cylindrical structure, and the yoke has a ⊏-shaped box shape. Accordingly, a free space can be secured in a side of a fixed core, and thus, a compact product can be manufactured.

Moreover, the manipulating circuit part with a built-in inverting switch is provided in the secured side space of the fixed core, and thus, a consumption current applied to a coil is reduced due to a circuit structure of the manipulating circuit part. Accordingly, a contact operates within an allowable rated voltage range and an allowable limit temperature of the coil, and moreover, the coil having a broad rated voltage range is used.

The movable core may have a cylindrical shape.

The yoke may be detachably coupled to a side of the bobbin.

The yoke may include first and second yokes provided to be separable from and contactable with each other.

Each of the first and second yokes may include a plurality of contacts and a connecting part.

The plurality of contacts may be disposed to be separated from each other in an axial direction of the bobbin and to face each other on the same plane.

The connecting part may be disposed in parallel with a moving direction of the bobbin to connect ends of the plurality of contacts.

In each of the first and second yokes, a semicircular opening may be formed at one of the plurality of contacts, and insertion of the movable core into the semicircular opening may be allowed. Also, the other contact may be formed in a closed structure to stop movement of the movable core.

The manipulating circuit part may include a printed circuit board (PCB), an inverting switch, and a voltage dropping element.

The inverting switch may be provided on the PCB, wherein the inverting switch is switched on or off on the contrary to a contact of a main circuit.

The voltage dropping element may be provided on the PCB, wherein when the inverting switch is inverted, the voltage dropping element drops an external voltage applied thereto to reduce a voltage applied to a coil.

The voltage dropping element may be a capacitor.

The manipulating circuit part may further include a rectifying element configured to convert external AC power into DC power.

The bobbin may include a plurality of yoke inserting parts respectively disposed at both ends of a bobbin body to be separated from each other in the moving direction of the movable core, and configured to guide insertion of the yoke.

The frame may include a holder movably provided in the frame.

The holder may be configured to include a support guide part and support the movable core.

The movable core may include a connecting member, a support, and a supporting pin.

The connecting member may be coupled to one end of the movable core.

The support may be provided at the connecting member.

The support may be configured to include an inserting hole which is formed at each of both sides.

The supporting pin may be assembled to pass through the inserting hole, and slidably inserted into and coupled to an inner surface of the support guide part.

The inverting switch may be mounted on the manipulating circuit part as one body, and modularized.

The bobbin may include a coil power input terminal and a coil power input member.

The coil power input terminal may be provided at each of a power source side and a load side, and connected to an external terminal.

The coil power input member may be configured to connect the coil power input terminal to the manipulating circuit part to apply the external power to the manipulating circuit part.

The inverting switch may be disposed between the coil power input terminal and the rectifying element.

According to a second embodiment of the present invention, the frame may include a holder.

The holder may be movably provided in the frame.

The holder may be configured to include a support guide part and support the movable core.

The movable core may include a connecting member and a support.

The connecting member may be coupled to one end of the movable core.

The support may be provided at the connecting member.

The support may be configured to include a plurality of sliding projections which are respectively formed to protrude toward each other at both sides, and sliding-coupled to the support guide part.

As described above, the magnetic contactor according to the embodiments of the present invention prevents a coil from being overheated, and thus uses a coil having a broad rated voltage range. Also, a structure of a product can be simplified, and a space can be broadly used.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of this specification, illustrate exemplary embodiments and together with the description serve to explain the principles of the disclosure.

In the drawings.

DETAILED DESCRIPTION OF THE DISCLOSURE

Description will now be given in detail of the exemplary embodiments, with reference to the accompanying drawings. For the sake of brief description with reference to the drawings, the same or equivalent components will be provided with the same reference numbers, and description thereof will not be repeated.

The present disclosure relates to a magnetic contactor in which a structure of a product is compactly configured, and a manipulating coil has a broad rated voltage range.

Figure 1:
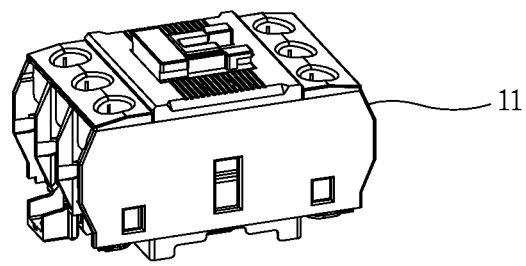
FIG. 1 is an exploded perspective view schematically illustrating a configuration of a general medium•low-capacity magnetic contactor.
Figure 1:
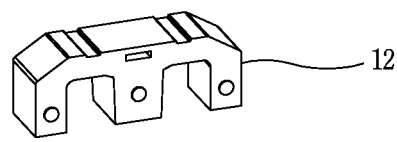
Figure 1:
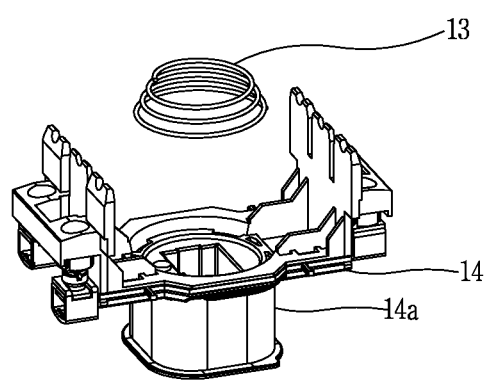
Figure 1:
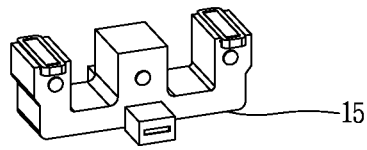
Figure 1:
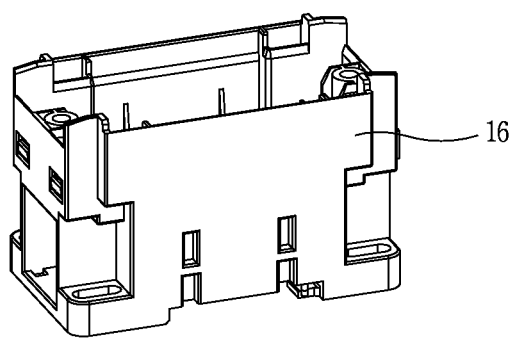
Figure 2:
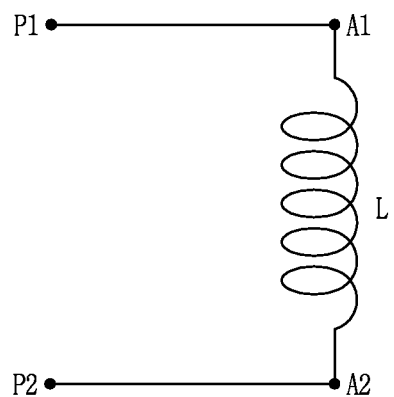
FIG. 2 is a circuit diagram of a manipulation circuit part of a low-capacity magnetic contactor of the prior art.
Figure 3:
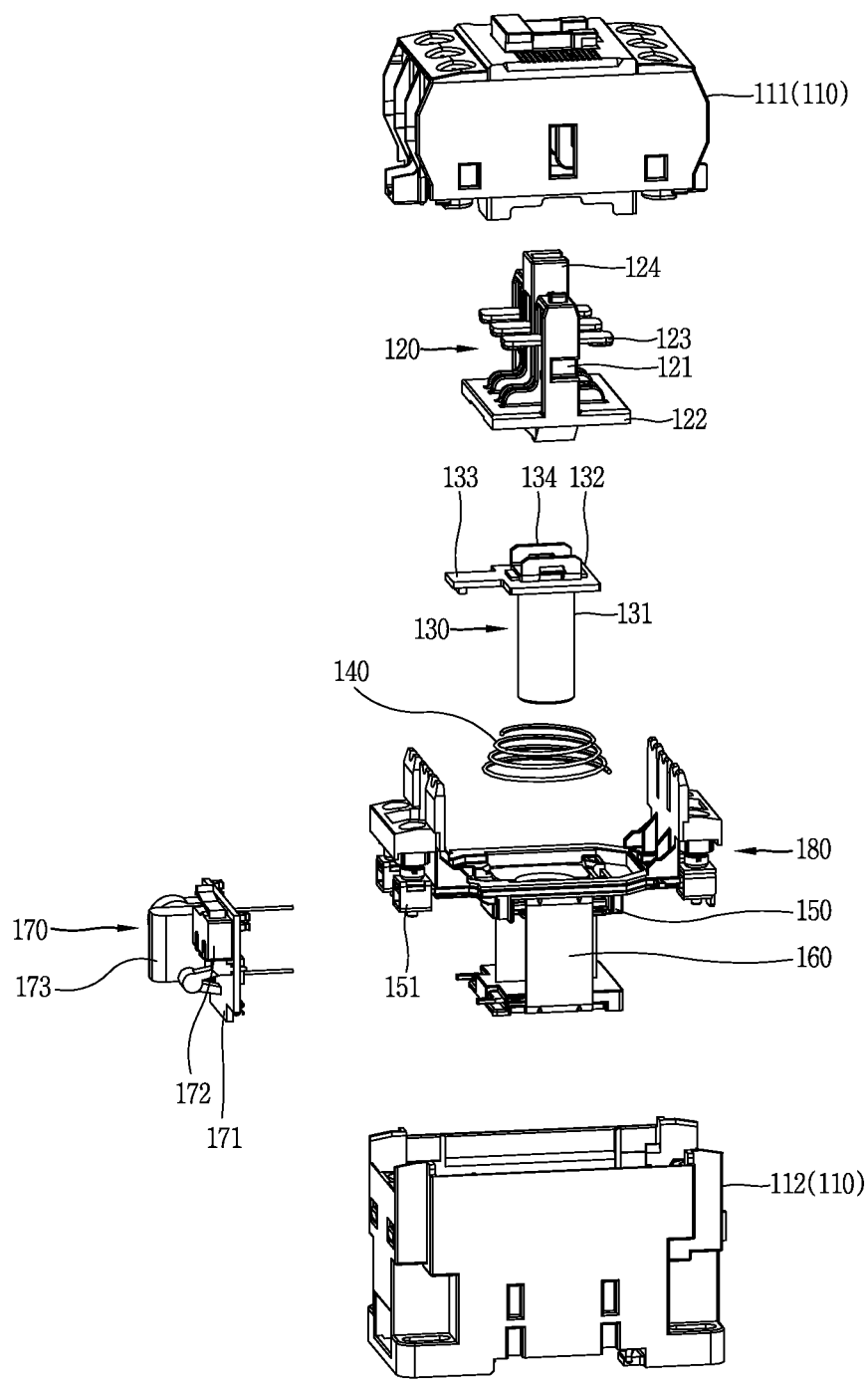
FIG. 3 is an exploded perspective view illustrating elements of a magnetic contactor according to an embodiment of the present invention.

FIG. 3 is an exploded perspective view illustrating elements of a magnetic contactor according to an embodiment of the present invention.

As illustrated in FIG. 3, the magnetic contactor according to an embodiment of the present invention includes a first frame 111, a holder 120, a movable part 130, an elastic member 140, a fixed part 180, a manipulating circuit part 170, and a second frame 112.

The first frame 111 and the second frame form an external frame of a product in a rectangular box shape.

The holder 120 includes a pillar member 121 that is vertically disposed at the middle of the holder 120 in a pillar shape, a base member 122 that is disposed at a lower end of the pillar member 121, and a plurality of three-phase movable contacts 123 that are provided in parallel at both sides of the pillar member 121.

The movable part 130 includes a movable core 131 that is formed in a cylindrical shape, a connecting member 132 that is disposed at an upper end of the movable core 131 to connect the holder 120 to the movable core 131, and a support 134 that is provided on the connecting member 132 to support the movable core 131 to the holder 120.

The movable core 131 has a smaller diameter than an inner diameter of the bobbin 150 which is disposed at the fixed part 180. That is, the diameter of the movable core 131 is far smaller than that of the prior art movable core 131 having an E-shape in a left and right length direction of the first frame 111, and an axial-direction length of the movable core 131 is long. The movable core 131 having the above-described structure may be inserted into the bobbin 150 in an axial direction (an up and down direction in the drawing). A diameter of the bobbin 150 is reduced by the movable core 131 having the structure, and a side space between an inner surface of the second frame 112 and the bobbin 150 may be used as an installation space of the manipulating circuit part 170.

When external power applied to the coil 156 dissipates, the elastic member 140 may restore the movable part 130 and the holder 120 to the original position with an elastic restoring force, and use a coil spring in which a coil is wound in a spiral shape.

The fixed part 180 may include a bobbin 150, which includes a coil 156 and generates a magnetic field, and a yoke 160 that is coupled to a width-direction side of the bobbin 150 in a box shape.

The manipulating circuit part 170 may include a printed circuit board (PCB) 171, which is vertically disposed in a side space of a power source side of the bobbin 150, and an inverting switch 172 that is mounted on the PCB 171.

Figure 4:
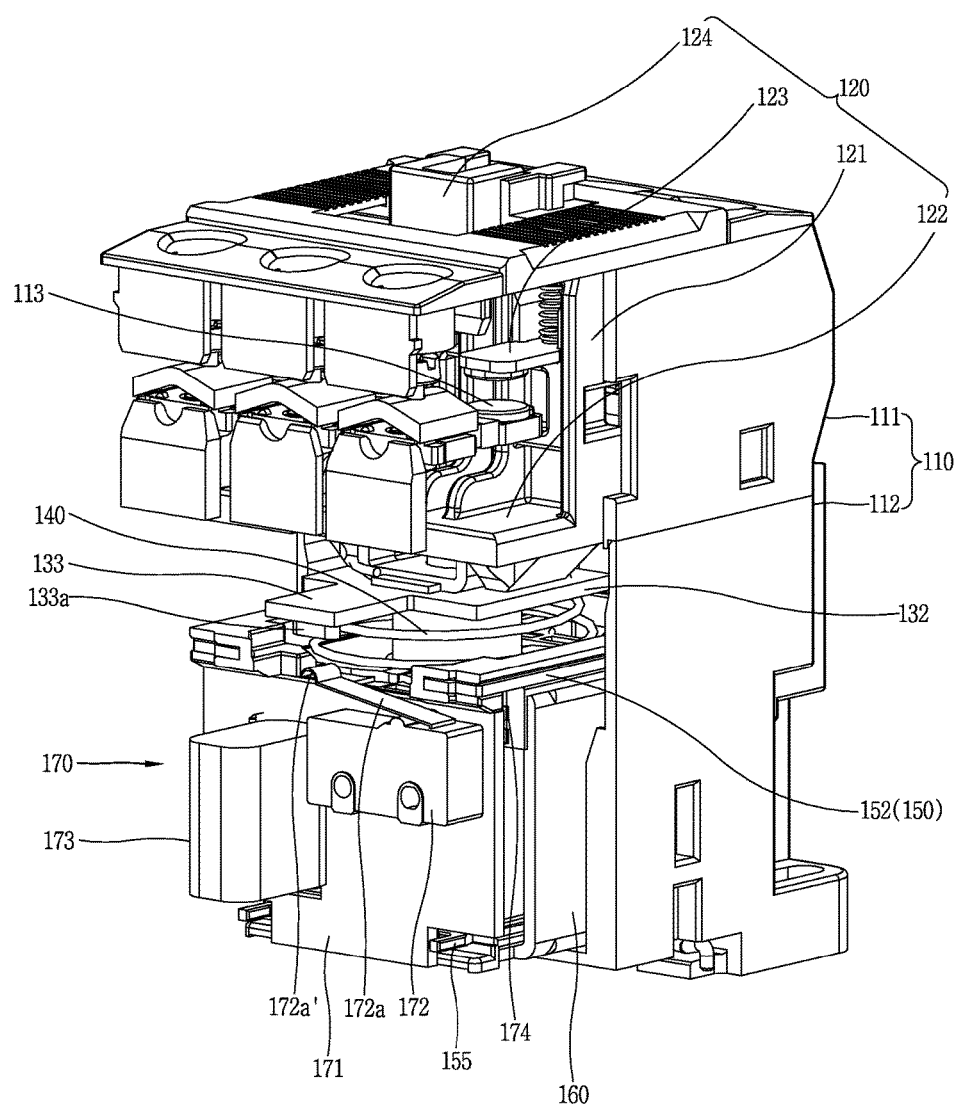
FIG. 4 is an assembly view of a low-capacity magnetic contactor according to an embodiment of the present invention, and illustrates internal elements which are shown by partially cutting a side portion of a power source side of a frame.

FIG. 4 is an assembly view of a low-capacity magnetic contactor according to an embodiment of the present invention, and illustrates internal elements which are shown by partially cutting a side portion of a power source side of the frame 110.

As illustrated in FIG. 4, the first frame 111 and the second frame 112 are assembled with each other so that a lower border of the first frame 111 which is opened in a down direction faces an upper border of the second frame 112 which is opened in an up direction. An accommodating space is formed in the assembled first and second frames 111 and 112, and accommodates the holder 120, the movable part 130, the fixed part 180, the elastic member 140, and the manipulating circuit part 170.

The holder 120 may be provided in the first frame 111 to be movable in an up and down direction, and a pressing part 124 is formed to protrude at an upper end of the holder 120. The pressing part 124 may be exposed to the outside of the first frame 111, and thus, a user may manually manipulate the holder 120.

A side of a front (a power source side) side of the first frame 111 may be cut, and among elements accommodated in a product, a movable contact 123 may be provided at one side of the holder 120 to be movable in an up and down direction. In this case, the movable contact 123 may be elastically supported by a spring.

A main power terminal provided in three-phases (R, S, and T phases) may be included in the first frame 111, and a fixed contact 113 may be fixed to and provided at an end of the main power terminal of the power source side to be separated from the movable contact 123 in an up and down direction. The movable part 130 and the holder 120 may be lowered by an absorbing force of an electromagnet which is generated when the user presses the pressing part 124 of the holder 120 or the external power is applied to the coil 156, and the movable contact 123 which operates as one body with the holder 120 may be lowered to contact the fixed contact 113.

Moreover, a fixed member for the main power terminal may be provided for each of three phases on the fixed contact 113 provided in the first frame 111. A line terminal of the power source side and a line terminal of a load side may be inserted and fixed on the main power terminal by using the fixed member.

The movable part 130 may include the connecting member 132 that has a tetragonal plate shape and is disposed on the movable core 131, a switch manipulating part 133 that is formed to protrude in a horizontal direction at one side of the connecting member 132, and a switch manipulating projection 133a that is formed to protrude in a down direction at a bottom of the switch manipulating part 133.

The connecting member 132 has two functions. A first function is a connecting function that connects the holder 120 to the movable core 131, and a second function is a switch manipulating function in which the switch manipulating projection 133a presses a switch operating lever 172a of the inverting switch 172, which is disposed under the switch manipulating part 133 of the connecting member 132, to invert an internal contact (where an inversion denotes switching the internal contact from an on position to an off position.

The coil spring 140 may be disposed between a lower end of the holder 120 and an upper end of the bobbin 150. In this case, a diameter of an upper end of the coil spring 140 may be smaller than that of a lower end of the coil spring 140, and the upper end of the coil spring 140 contacts and is supported by the lower end of the holder 120. Therefore, an elastic restoring force is applied to the lower end of the holder 120, and the lower end of the coil spring 140 is fixed to the upper end of the bobbin 150.

The bobbin 150 of the fixed part 180 may include a coil power input member 152 that is formed of a conductive material, connected to an external coil power input terminal (not shown), and provided at the upper end of the bobbin 150. The PCB 171 of the manipulating circuit part 170 may be directly coupled to one side of the coil power input member 152 by using a connecting ring 174, and thus, the external power input from a coil power input terminal 151 may be directly applied to the manipulating circuit part 170 through the coil power input member 152 of the bobbin 150 without a separate element. In this case, the coil power input member 152 may be provided as an element of the bobbin 150, and may be insulated by an insulating member which is formed of an insulating material such as plastic and has a plate shape.

A side space of one side (a front surface in FIG. 4) of the bobbin 150 may be used as an installation space of the PCB 171 of the manipulating circuit part 170, and thus, a product can be simply configured and miniaturized. That is, the PCB 171 of the manipulating circuit part 170 may be disposed in the side space of the bobbin 150 in parallel with a moving direction of the movable core 131, and thus, interference between the PCB 171 and the movable core 131 can be prevented. For example, when the PCB 171 is horizontally disposed on the bobbin 150, an inserting hole should be secured in the PCB 171 so that the movable core 131 is movably inserted into the PCB 171, and thus, a portion of an area of the PCB 171 cannot be used. Also, in this case, due to interference of the movable core 131 and the PCB 171, a space is limited in disposing and designing the movable core 131 and a spring (the elastic member 140). In addition, a separate processing process is added for forming an inserting hole for securing mobility in the PCB 171, and a space for providing an electronic element on the PCB 171 is reduced in proportion to an area of the inserting hole. For this reason, a size of the PCB 171 is inevitably enlarged, causing difficulty to miniaturize a product.

Moreover, the PCB 171 may include the inverting switch 172 and a capacitor 173 (a voltage dropping element) which are provided as one body, and the switch operating lever 172a having a strip type may be diagonally coupled to one side of the inverting switch 172 in a hinge structure. Therefore, the inverting switch 172 of which a contact is normally closed may connect an external power source to the coil 156, and the inverting switch 172 may be pressed and inverted by the switch manipulating projection 133a of the movable part 130. Simultaneously, the external power may flow to the coil 156 through the capacitor 173. Therefore, a voltage of the external power source is dropped by the capacitor 173, and a consumption current applied to the coil 156 is reduced.

Moreover, as described above, even when the consumption current of the coil 156 is reduced, an absorbing force of an electromagnet for maintaining a contact state of the movable contact 123 and the fixed contact 113 is secured.

Figure 5:
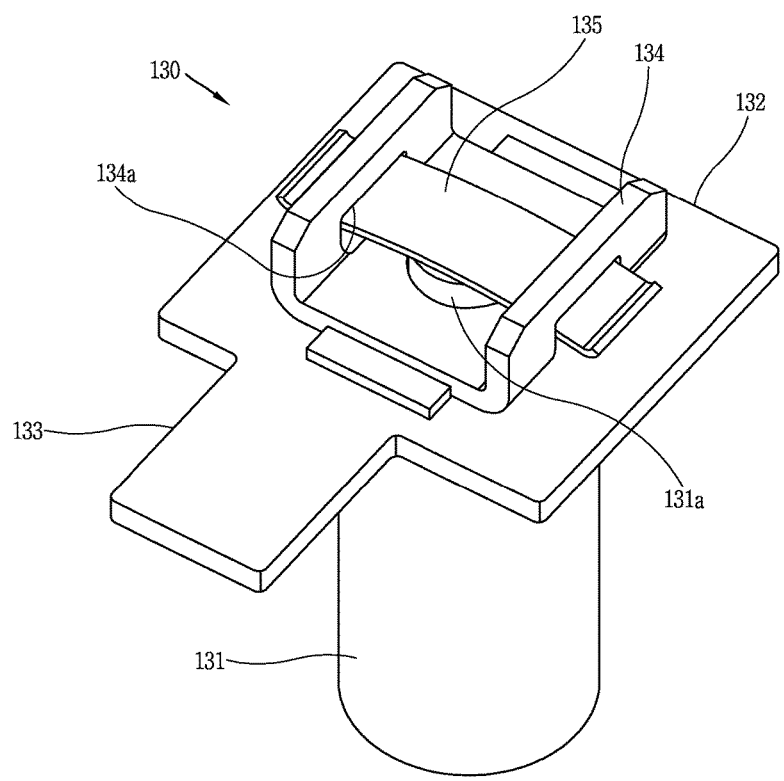
FIG. 5 is a perspective view of a movable part according to a first embodiment of the present invention.

FIG. 5 is a perspective view of a movable part 130 according to a first embodiment of the present invention.

As illustrated in FIG. 5, the movable part 130 may include a cylinder-shaped movable core 131, a connecting member 132 that is disposed at an upper end of the movable core 131, and a support 134 that is provided on the connecting member 132 and coupled to the holder 120 by a supporting pin 135.

The connecting member 132 may be formed in a tetragonal plate shape, and a switch manipulating part 133 may be formed to protrude in a direction of a power source side at one side corner of a tetragonal plate and may press the inverting switch 172.

In this case, a circle-shaped coupling part 131a may be formed to protrude in an axial direction at an upper end of the movable core 131 so that a diameter of the coupling part 131a is smaller than that of the movable core 131, and a through hole may be formed at each of bottoms of the connecting member 132 and the support 134. The coupling part 131a may pass through the through hole, and the connecting member 132 and the support 134 may be fixed to, as one body, an upper end of the movable core 131 by a coupling means such as a riveting means.

The support 134 may include a supporting body that has a tetragonal plate shape and is provided at a top of the connecting member 132 so as to contact a surface therebetween, a plurality of side parts that are formed to extend in an up direction from both side ends of the supporting body, and an inserting hole 134a that is formed at each of the side parts.

The supporting pin 135 may be coupled to pass through the inserting hole 134a in an axial direction. The movable core 131 and the holder 120 may be mechanically connected to each other by the supporting pin 135, and may operate as one body.

Figure 6:
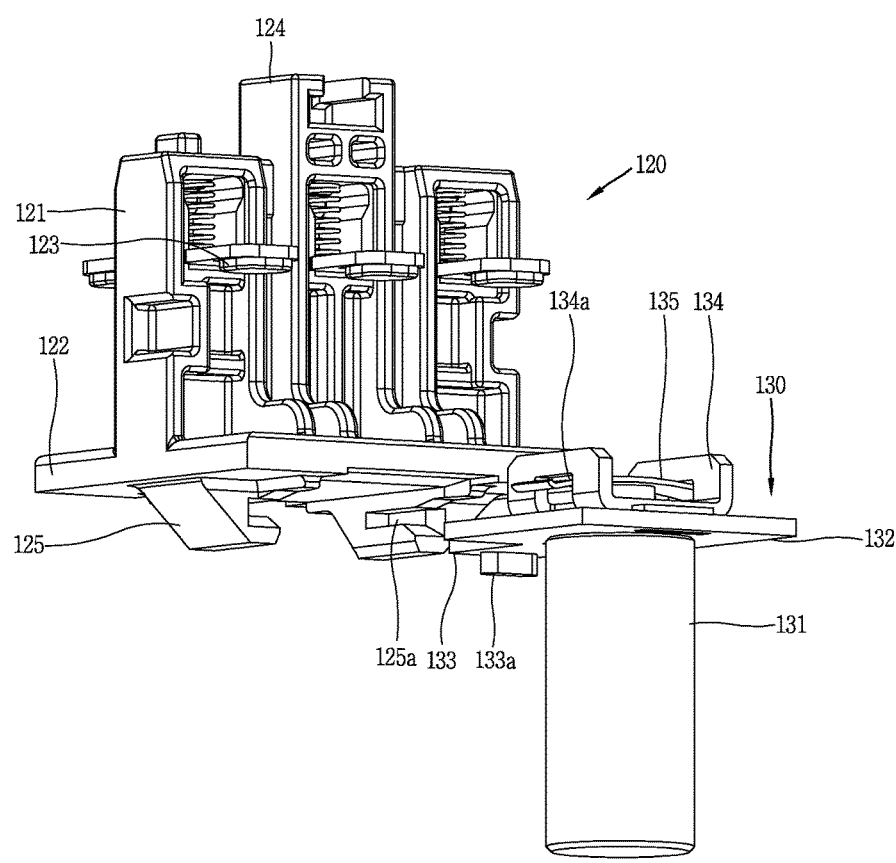
FIG. 6 is a perspective view illustrating a state before the movable part according to the first embodiment of the present invention is coupled to a holder.
Figure 7:
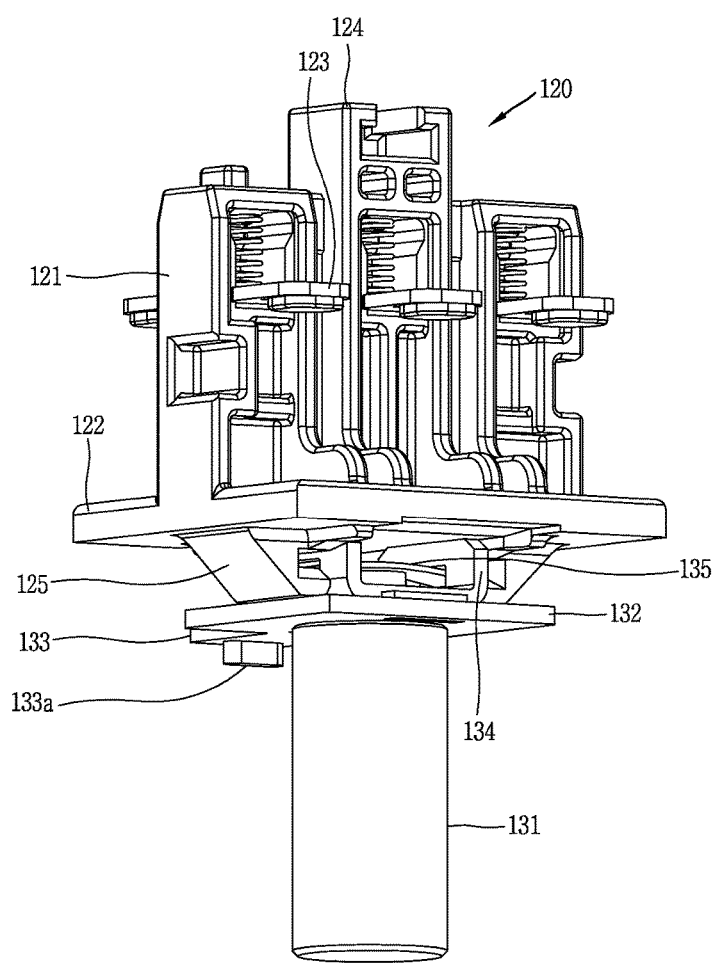
FIG. 7 is a coupled perspective view illustrating a state after the movable part of FIG. 6 is coupled to the holder.

FIG. 6 is a perspective view illustrating a state before the movable part 130 according to the first embodiment of the present invention is coupled to the holder 120, and FIG. 7 is a coupled perspective view illustrating a state after the movable part 130 of FIG. 6 is coupled to the holder 120.

As illustrated in FIG. 6, a support guide part 125 may be formed to protrude at a bottom of the holder 120, and a guide groove 125a may be continuously formed at an inner surface of the support guide part 125 along a length direction. The supporting pin 135 may be slidably inserted into and coupled to the guide groove 125a in a state of being assembled with the support 134 of the movable part 130.

As illustrated in FIG. 7, since the supporting pin 135 may be inserted into and coupled to the guide groove 125a, the holder 120 and the movable part 130 may operate as one body so as to be vertically movable in the first frame 111 and the second frame 112.

Figure 8:
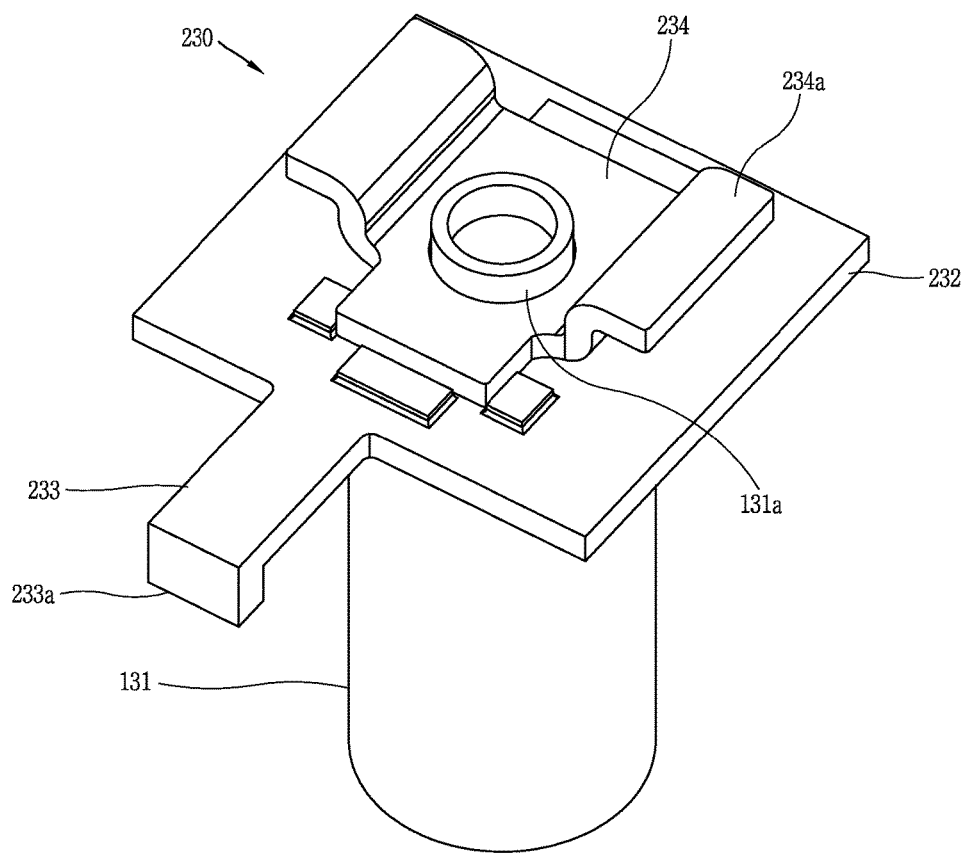
FIG. 8 is a perspective view of a movable part according to a second embodiment of the present invention.

FIG. 8 is a perspective view of a movable part 230 according to a second embodiment of the present invention.

The movable part 230 according to a second embodiment of the present invention may include a movable core 131 having a cylindrical shape, a connecting member 132 having a tetragonal plate shape, and a support 234. The movable core 131, connecting member 132, and support 234 of the movable part 130 according to the second embodiment of the present invention respectively correspond to the movable core 131, connecting member 132, and support 134 of the movable part 130 according to the first embodiment of the present invention. A width of a switch manipulating part 233 according to the second, which is formed to protrude at one side end of the connecting member 132, may be narrower than that of the switch manipulating part 133 according to the first embodiment. A switch manipulating projection 233a according to the second embodiment may be bent in a directly lower direction from an end of the switch manipulating part 133, but the switch manipulating projection 133a according to the first embodiment may be inward disposed in a direction from an end of the switch manipulating part 133 to the movable core 131. Also, the support 234 according the second embodiment may not include a separate supporting pin 135, and may include a sliding projection 234a that is formed to protrude in an axial direction from a side part of the support 234. The sliding projection 234a may be inserted into and coupled to the support guide part 125 of the holder 120.

Figure 9:
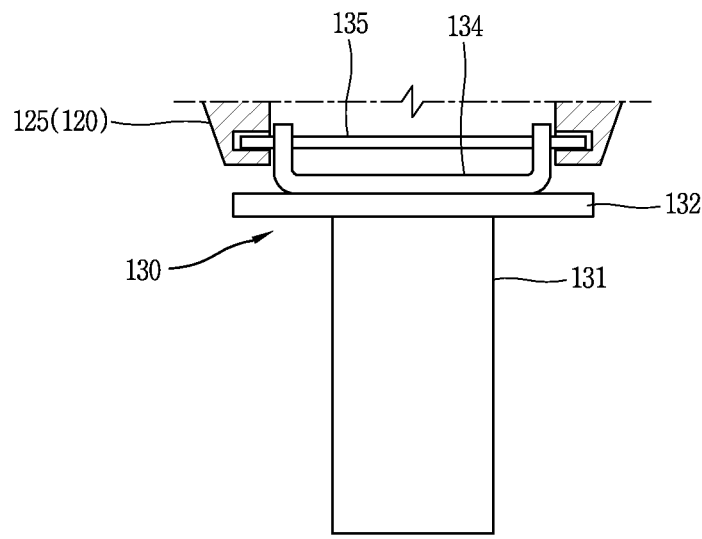
FIG. 9 is a cross-sectional view illustrating a state before the movable part and the holder according to the first embodiment of the present invention are coupled to each other.
Figure 10:
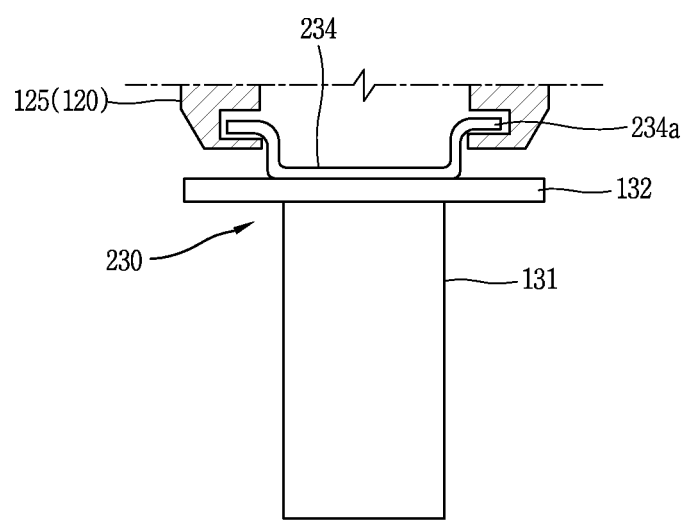
FIG. 10 is a cross-sectional view illustrating a state before the movable part and a holder according to the second embodiment of the present invention are coupled to each other.
Figure 11:
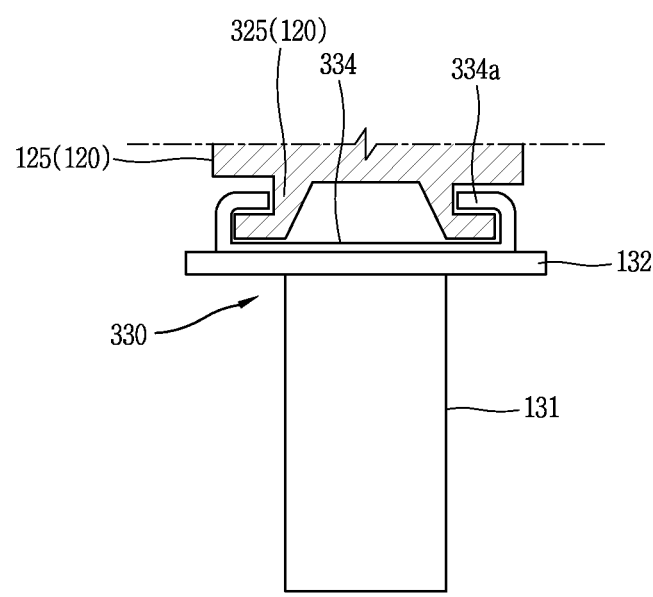
FIG. 11 is a cross-sectional view illustrating a state before a movable part and a holder according to a third embodiment of the present invention are coupled to each other.

FIG. 9 is a cross-sectional view illustrating a state before the movable part 130 and the holder 120 according to the first embodiment of the present invention are coupled to each other. FIG. 10 is a cross-sectional view illustrating a state before the movable part 230 and the holder 120 according to the second embodiment of the present invention are coupled to each other. FIG. 11 is a cross-sectional view illustrating a state before a movable part 330 and a holder 120 according to a third embodiment of the present invention are coupled to each other.

The supporting pin 135 of the movable part 130 illustrated in FIG. 9 may be inserted into and coupled to the support guide part 125 of the holder 120, and thus, the holder 120 and the movable part 130 may interoperate as one body in an up and down direction.

Moreover, the sliding projection 234a of the movable part 230 illustrated in FIG. 10 may be formed to protrude in an outward direction from a side part of the support 234, and may be inserted into and coupled to the support guide part 125 of the holder 120. Therefore, the holder 120 and the movable part 230 may interoperate as one body in an up and down direction.

In addition, a sliding projection 334a of the movable part 330 illustrated in FIG. 11 may be formed to protrude in an inward direction from a side part of a support 334, and may be inserted into and coupled to a support guide part 325 of the holder 120. Therefore, the holder 120 and the movable part 330 may interoperate as one body in an up and down direction.

Figure 12:
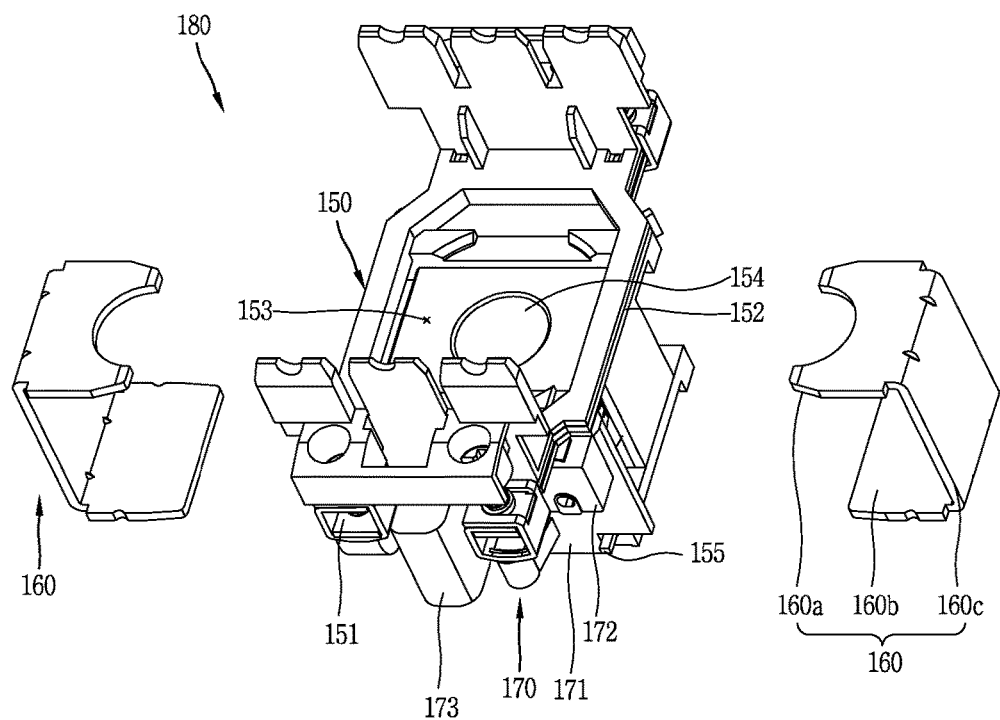
FIG. 12 is an exploded perspective view of a fixed part according to an embodiment of the present invention.

FIG. 12 is an exploded perspective view of a fixed part 180 according to an embodiment of the present invention.

As illustrated in FIG. 12, the fixed part 180 may include a bobbin 150 and a yoke 160 that is coupled to both sides of the bobbin 150 in a width direction.

The bobbin 150 may include a bobbin body 150a having a cylindrical shape and a yoke inserting part 153 that has a box shape and is concavely formed at each of an upper end and lower end of the bobbin body 150a. An opening may be formed at a width-direction side of the yoke inserting part 153, and the yoke inserting part 153 may be inserted into and coupled to the yoke inserting part 153 through the opening.

The bobbin body 150a may include a hollow part which is formed therein, and a coil may be wound around an outer surface of the bobbin body 150a.

In particular, a coil power input terminal 151 may be provided at each of both ends in a length direction from an upper end of the bobbin 150, and external power may be applied through the coil power input terminal 151.

Moreover, a coil power input member 152 may be provided at an upper end of the bobbin body 150a. The coil power input member 152 having a plate shape may directly connect the coil power input terminal 151 to a manipulating circuit part 170, and thus provide an electricity conducting path between the coil power input terminal 151 and the manipulating circuit part 170.

Moreover, a coil terminal 155 may be provided at a lower end of the bobbin 150. The coil terminal 155 may be directly connected to the manipulating circuit part 170, and may allow a current, controlled in the manipulating circuit part 170, to be applied to the coil 156.

The yoke 160 may have a structure in which one surface of a plate is opened, the other three surfaces are closed, and the plate is bent in a ⊏-shape. An upper end 160a and a lower end 160b of the bending-processed yoke 160 may be slidably inserted into a yoke inserting part 153, which is provided at each of the upper end and lower end of the bobbin 150, in a width direction of the bobbin 150, and may be assembled to contact each other.

In this case, a circular opening may be formed at the upper end 160a of the yoke 160, and the movable core 131 may be inserted into a hollow part 154, which is formed in the bobbin 150, through the opening.

Moreover, the lower end 160b of the yoke 160 may be blocked in a plane shape, and when the movable core 131 is lowered, the lower end 160b of the yoke 160 may act as a stopper in order for the movable core 131 not to be lowered by a certain distance "l" or more.

Here, a connecting part 160c which connects the upper end 160a and the lower end 160b of the yoke 160 forms a magnetic path for a magnetic field which is generated around the coil 156. The yoke 160 may be wholly magnetized by the magnetic field.

Figure 13:
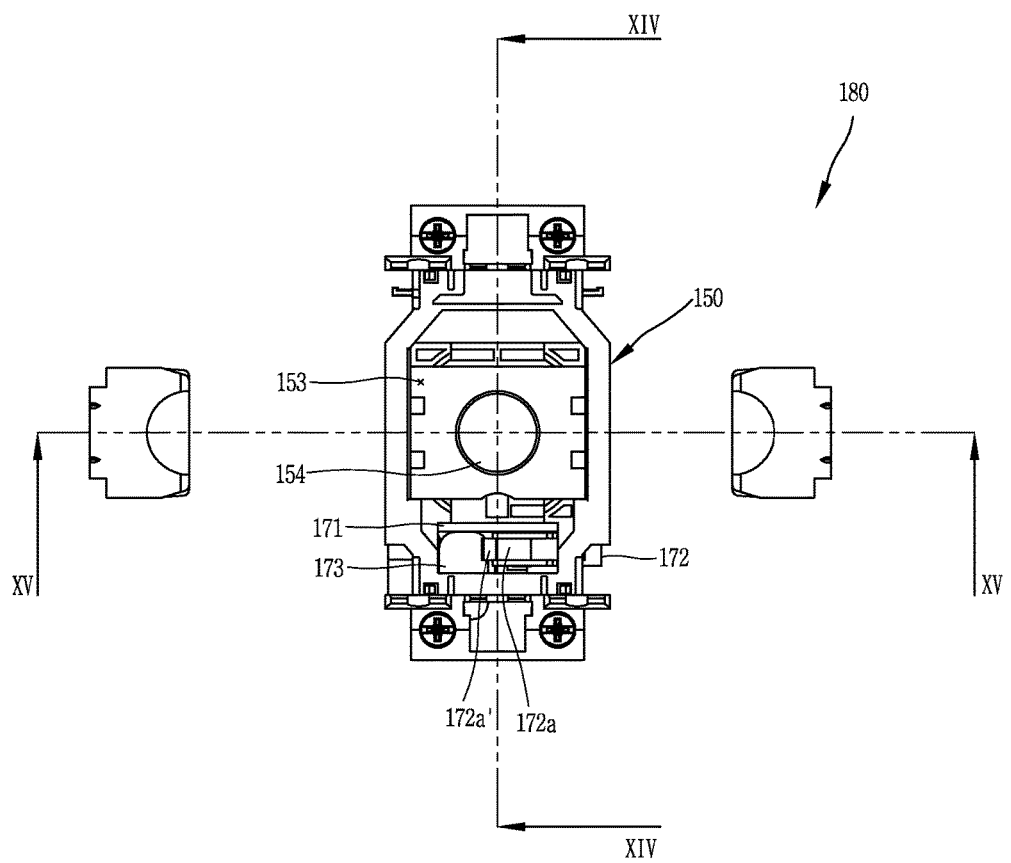
FIG. 13 is a plan view of the fixed part of FIG. 12.
Figure 14:
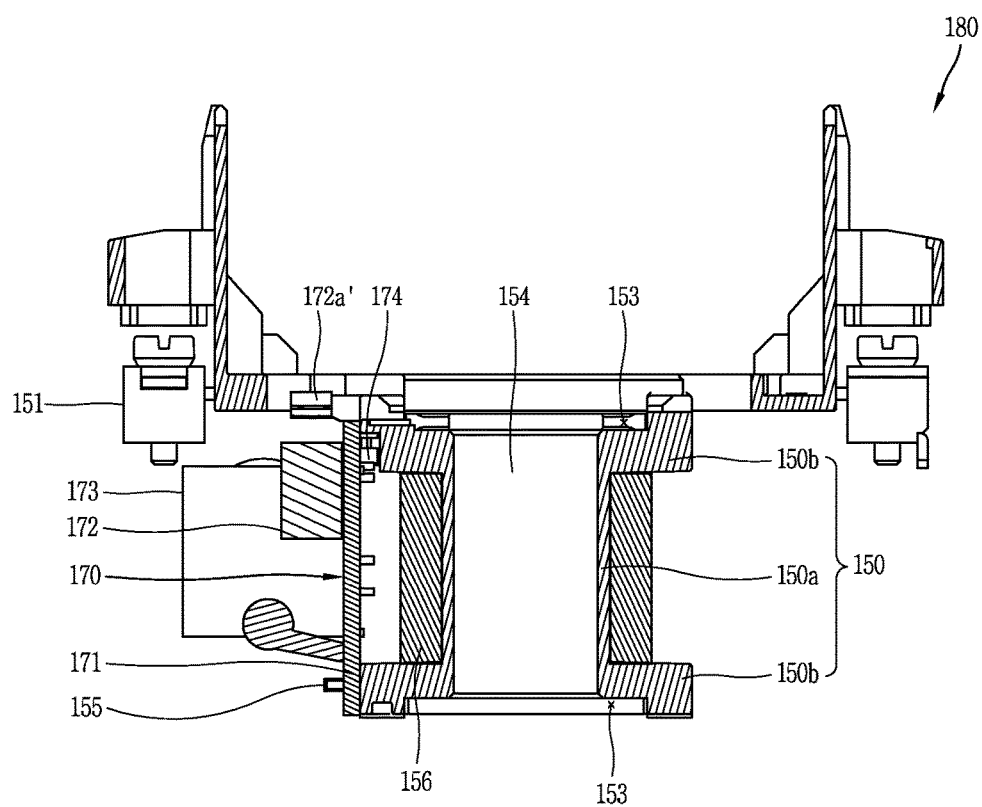
FIG. 14 is a cross-sectional view taken along line XIV-XIV of FIG. 13.
Figure 15:
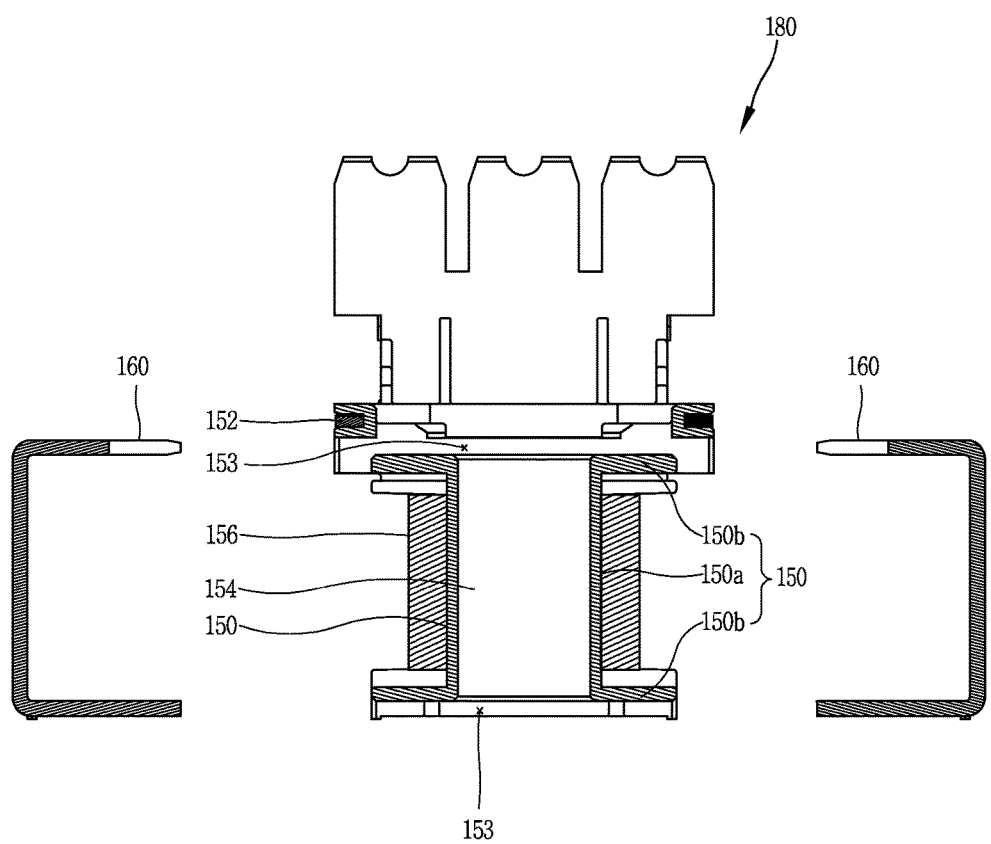
FIG. 15 is a cross-sectional view taken along line XV-XV of FIG. 13.

FIG. 13 is a plan view of the fixed part 180 of FIG. 12. FIG. 14 is a cross-sectional view taken along line XIV-XIV of FIG. 13. FIG. 15 is a cross-sectional view taken along line XV-XV of FIG. 13.

As illustrated in FIG. 14, the coil power input terminal 151 may be provided at one side (left) end of the upper end of the bobbin 150, and the external power may be applied to the manipulating circuit part 170 through the coil power input member 152 which is provided at the upper end of the bobbin 150.

The manipulating circuit part 170 may be directly coupled to a side of the power source side of the bobbin 150 through the connecting ring 174, and may be supplied with an operating voltage of the coil 156 from the outside without a separate element.

Here, the manipulating circuit part 170 may include the PCB 171 that has a plane shape and is disposed in a vertical direction, the inverting switch 172 that is mounted on the PCB 171, and the capacitor 173 that is provided on the PCB 171 to be separated from the inverting switch 172 in the width direction of the bobbin 150.

The inverting switch 172 may include the switch operating lever 172a, which is slopingly disposed in a strip type at an upper side of the switch body, and the fixed contact and the movable contact which are provided in the switch body.

The inverting switch 172 may be a b-contact switch in which an internal contact is normally closed, and when a signal is applied from the outside through the switch operating lever 172a, a movable contact operates and is separated (OFF) from a fixed contact.

Here, when the external power is applied, the inverting switch 172 may connect the coil power input terminal 151 to the coil 156, and transfer a current, applied from the coil power input terminal 151, to the coil 156.

Moreover, the inverting switch 172 may receive a signal from the outside according to a mechanical operation of the movable part 130. That is, as illustrated in FIG. 4, when the switch manipulating projection of the movable part 130 is lowered by an absorbing force of an electromagnet, the switch manipulating projection of the movable part 130 presses the switch operating lever 172a to invert the inverting switch 172. Here, inversion denotes switching off an internal contact which is normally closed (ON state).

The switch operating lever 172a of the inverting switch 172 may include a hinge part which is formed at a lower end to be bent, and the hinge part may be disposed in the switch body. When the upper end of the switch operating lever 172a is a free end and is pressed by the switch manipulating projection, the movable contact may be separated from the fixed contact 113.

The switch operating lever 172a may have a strip structure and elasticity, and when a pressing force of the switch manipulating projection 133a is released, the switch operating lever 172a may be restored to the original position by an elastic restoring force. Also, as illustrated in FIG. 4, a contact end 172a' having an arc shape may be formed at an end of the switch operating lever 172a, and easily contacts the switch manipulating projection of the movable part 130.

The manipulating circuit part 170 may allow a current, which is input through the coil power input terminal 151, to pass through the capacitor 173 simultaneously with that the inverting switch 172 is inverted, and thus, a current to be applied to the coil 156 is consumed. Therefore, an absorbing force for maintaining a contact state of the movable contact 123 and the fixed contact may be provided with low consumption power of the coil 156.

The bobbin 150 may include a coil winding part 150a, which has a cylindrical shape and includes a hollow part 154 formed therein, and a flange part 150b that is formed to protrude in an outward direction from an upper end and a lower end of the coil winding part 150a.

The coil 156 may be wound around an outer surface of the coil winding part 150a a plurality of times, and when the external power is applied to the coil 156, the coil 156 may generate a magnetic field to become an electromagnet. In this case, the coil winding part 150a is formed of an iron core material, and increases the magnetic field which is generated in the coil winding part 150a.

The flange part 150b, which is disposed at each of the upper end and lower end of the bobbin 150, may include the yoke inserting part 153 which is concavely formed therein. Therefore, the flange part 150b may guide and support the straight insertion of the yoke 160 in a width direction (direction XIV-XIV in the drawing).

Figure 16:
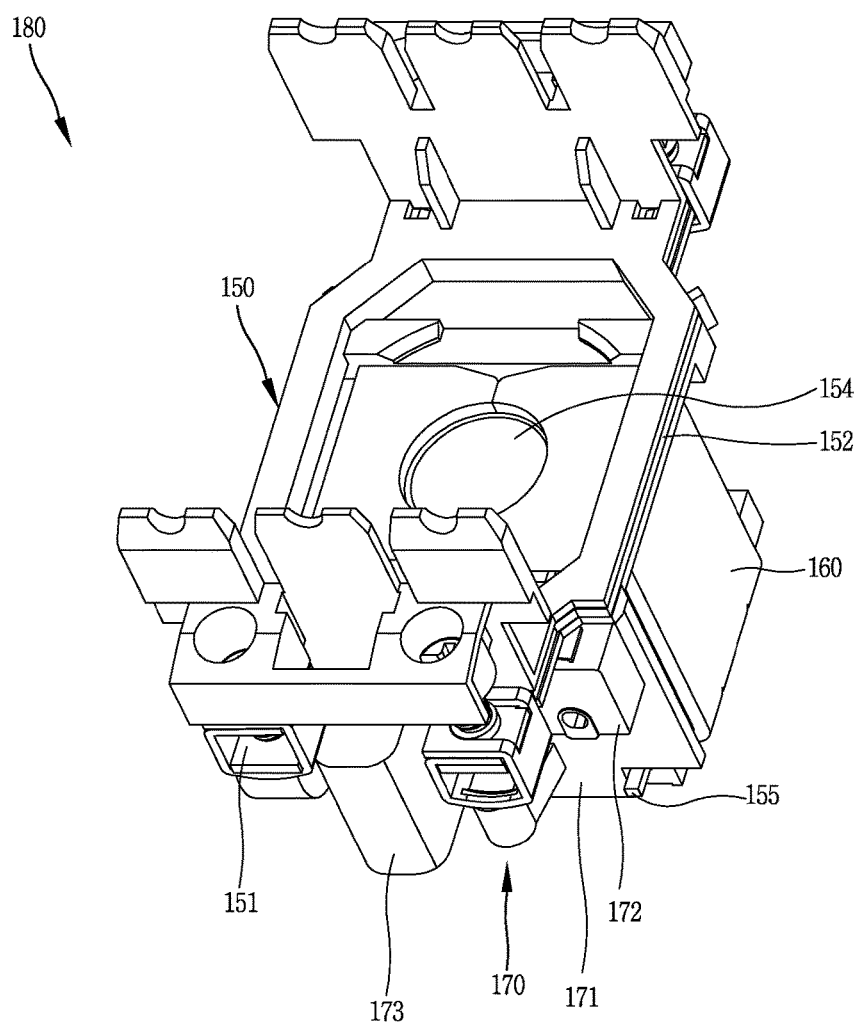
FIG. 16 is a perspective view illustrating a state in which a yoke is coupled to a bobbin according to a first embodiment of the present invention.
Figure 17:
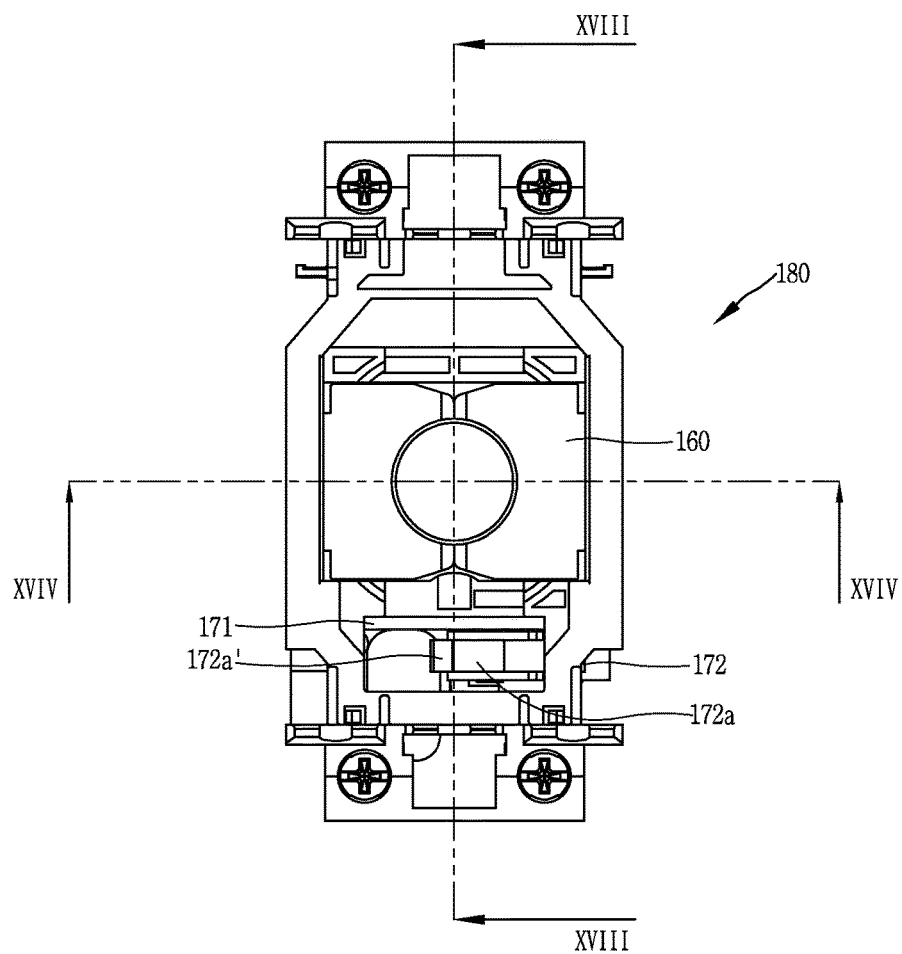
FIG. 17 is a plan view of FIG. 16.
Figure 18:
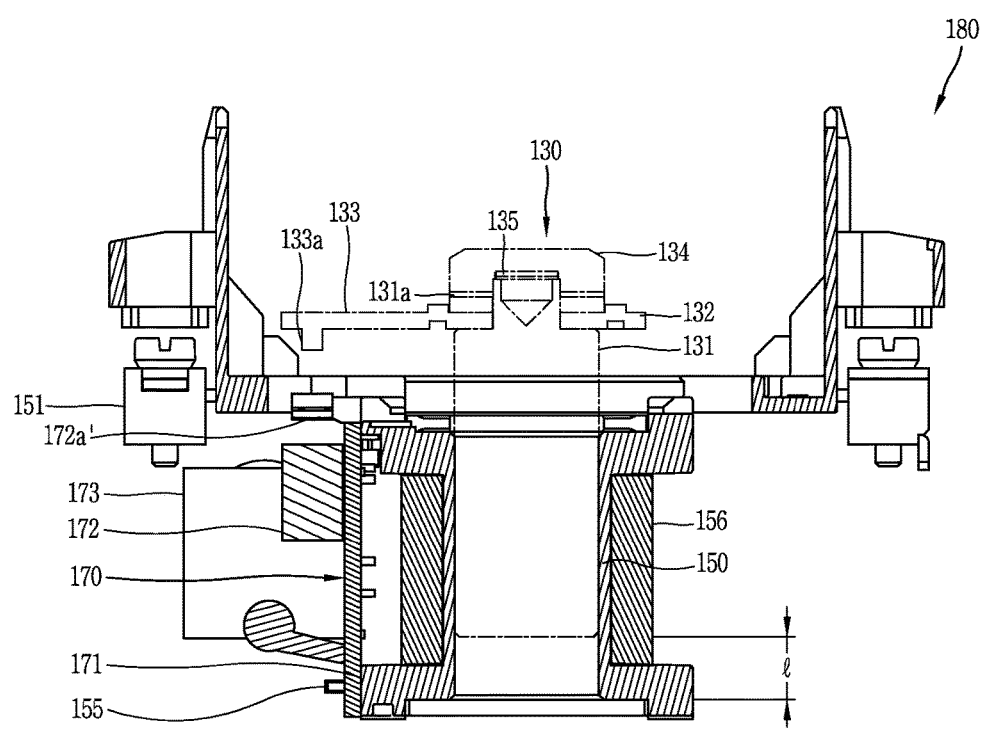
FIG. 18 is a cross-sectional view taken along line XVII-XVII of FIG. 17.
Figure 19:
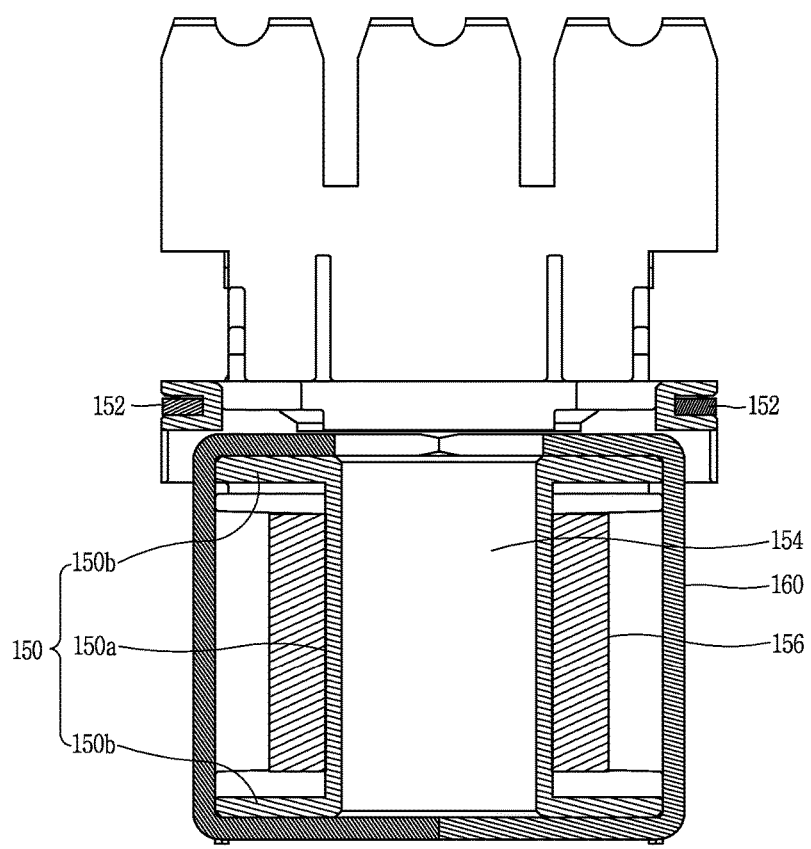
FIG. 19 is a cross-sectional view taken along line XVIV-XVIV of FIG. 17.

FIG. 16 is a perspective view illustrating a state in which the yoke 160 is coupled to the bobbin 150 according to a first embodiment of the present invention. FIG. 17 is a plan view of FIG. 16. FIG. 18 is a cross-sectional view taken along line XVII-XVII of FIG. 17. FIG. 19 is a cross-sectional view taken along line XVIV-XVIV of FIG. 17.

As illustrated in FIG. 16, a semicircular opening may be formed at an upper end of the yoke 160. When the yoke 160 having a ⊏-shape is inserted into and coupled to the opening through the yoke inserting part 153 of the bobbin 150 so as to symmetrically contact each other with respect to a length-direction central line (XVII-XVII of FIG. 17) of the bobbin 150 in both sides of the bobbin 150 in the width direction, the opening formed at the upper end of the yoke 160 may form a circular shape, and match the opening formed at the upper end of the bobbin 150. The movable core may be inserted into the hollow part 154 of the bobbin 150 through the opening.

As illustrated in FIG. 18, the yoke 160 may act as a fixed core for a magnetic field which is generated when power is applied to the yoke 160, and the upper end and lower end of the yoke 160 may be disposed to face and to be separated from the connecting member 132 of the movable part 130 and a bottom of the movable core 131 with an interval therebetween in an axial direction in a plane shape, respectively. Therefore, an absorbing force between the upper end of the yoke 160 and the connecting member 132 of the movable part 130 can be maximized.

Moreover, a moving distance of the movable part 130 may be determined based on an interval (a distance "l") between the bottom of the movable core 131 and the lower end of the yoke 160. This is because the lower end of the yoke 160 acts as the stopper, and thus, when the lower end of the movable core 131 is lowered, the lower end of the movable core 131 contacts the bottom of the yoke 160, and is no longer lowered.

Figure 20:
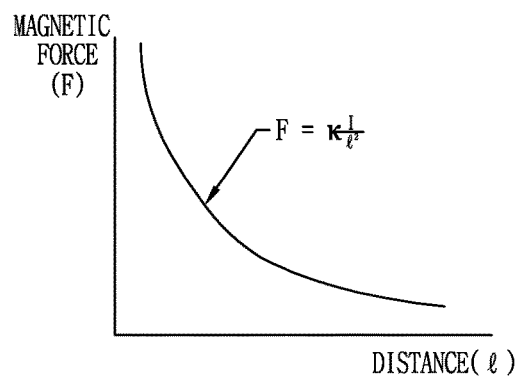
FIG. 20 is a graph showing a magnitude of a magnetic force based on a distance between two conductors to which the magnetic force is applied.

FIG. 20 is a graph showing a magnitude of a magnetic force "F" based on a distance "l" between two conductors to which the magnetic force is applied.

A magnetic force is applied to the movable part and the fixed part due to a magnetic field generated from the coil. In the present embodiment, the magnetic force denotes an absorbing force "F" with which the fixed part attracts the movable part, and a distance between objects to which the magnetic force is applied denotes a distance "l" between the bottom of the movable core and the lower end of the yoke.

In this case, a relation between the magnetic force "F" and the distance "l" between the objects to which the magnetic force is applied is expressed as the following Equation:

$$F = k\frac{I}{l^2}$$

where k denotes a proportional constant, and I denotes a current [A].

In the relation, the magnetic force (an absorbing force) is inversely proportional to the square of the distance between the objects to which the magnetic force is applied.

Therefore, when the same current is applied, as the distance becomes shorter, the magnetic force acting between the movable part and the fixed part increases in inverse proportion to the square of the distance.

In other words, the distance "l" between the bottom of the movable core and the lower end of the yoke has the maximum value before the external power is applied to the coil. When the external power is applied to the coil, the distance "l" between the bottom of the movable core and the lower end of the yoke is increasingly reduced due to an electromagnet, and thus, the magnetic force acting between the movable part and the fixed part increases as expressed in the relation.

Therefore, when a magnetic force for moving a movable contact (which is separated from a fixed contact) to a fixed contact before the external power is applied to the coil is assumed as F1, as the distance "l" is reduced by the magnetic force "F1", a magnetic force "F2" increases (F2>>F1). Also, once the movable contact contacts the fixed contact, a force "F" for maintaining a contact state of a contact part may be far smaller than the magnetic force "F2". This denotes that once the contact part is contacted, despite consumption power of the coil being reduced, the contact state of the contact part is sufficiently maintained.

Therefore, according to embodiments of the present invention, when the contact state of the contact part is maintained, by decreasing the consumption power of the coil, a temperature of the coil is lowered compared to the existing coil temperature, and thus, a resistance of the coil 156 can be prevented from increasing. Also, according to the safety standard, a contact may operate at a level corresponding to 85% of a rated voltage of the coil, and when a contact state of the contact is maintained, two conditions that prevent a limited temperate of the coil from being exceeded can all be satisfied.

Figure 21:
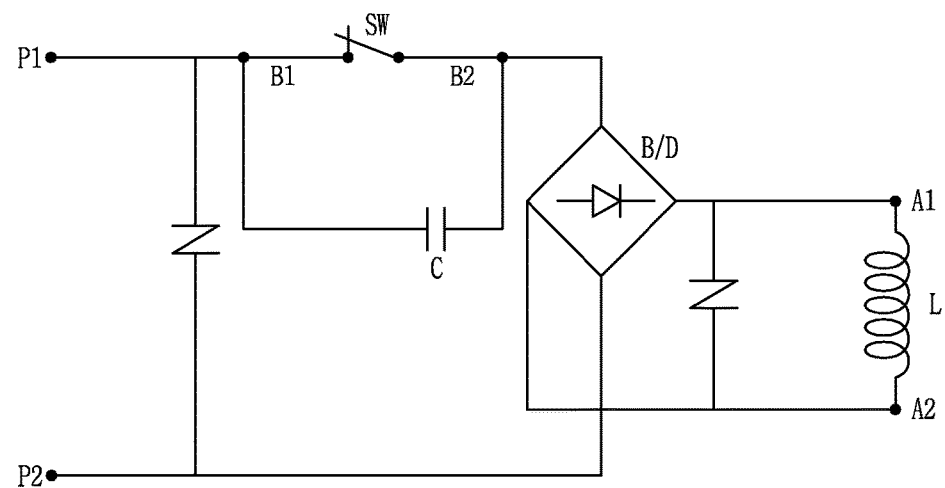
FIG. 21 is a circuit diagram of a manipulation circuit part according to an embodiment of the present invention.

FIG. 21 is a circuit diagram of a manipulation circuit part according to an embodiment of the present invention.

The manipulation circuit part according to an embodiment of the present invention may include a plate type PCB, an inverting switch SW, a voltage dropping element C, and a rectifying element B/D.

The PCB is an electronic board in which electronic elements such as the inverting switch SW are mounted as one module.

The inverting switch SW may sense that the distance "l" between the movable core 131 and the yoke 160 to which a magnetic force is applied is reduced. A degree of reduction in the distance "l" needs a degree which enables those skilled in the art to verify, through observation and experiment, that a magnetic force considerably increases in proportion to the reduction in the distance according to a relation between the magnetic force and the distance, but is not limited in the present invention.

The switch manipulating projection 133a of the movable part 130 is disposed within a movable distance, and the inverting switch SW is supplied with a physical contact signal from the switch manipulating projection 133a of the movable part 130, namely, the switch operating lever 172a of the inverting switch SW is pressed by the switch manipulating projection 133a of the movable part 130. Therefore, the inverting switch SW senses that the distance "l" between the movable core 131 and the yoke 160 is reduced. At this time, the external power flows to the capacitor C simultaneously with the inversion of the inverting switch SW.

In the present invention, the capacitor C used as a voltage dropping element is connected to both ends of the inverting switch SW to divide and drop a voltage. In this case, the capacitor C is serially connected between a plurality of external power input terminals P1 and P2 and a coil L, divides a voltage, and drops a voltage applied to the coil L in terms of the coil 156. For example, when an external source voltage is 100 V, by dividing the external source voltage, a voltage of 20 V is applied to the capacitor C, and a voltage of 80 V is applied to the coil L. In regard to the coil L, the capacitor C drops the external source voltage of 100 V by 20 V.

The rectifying element B/D may be configured with a bridge diode B/D, which may perform a DC converting function of converting (rectifying) AC power, applied via the inverting switch SW or the capacitor C, into DC power. Therefore, an absorbing force for moving the movable part 130 toward the fixed part 180 may be generated by applying a DC current, generated through conversion by the rectifying element, to the coil L.

Figure 22:
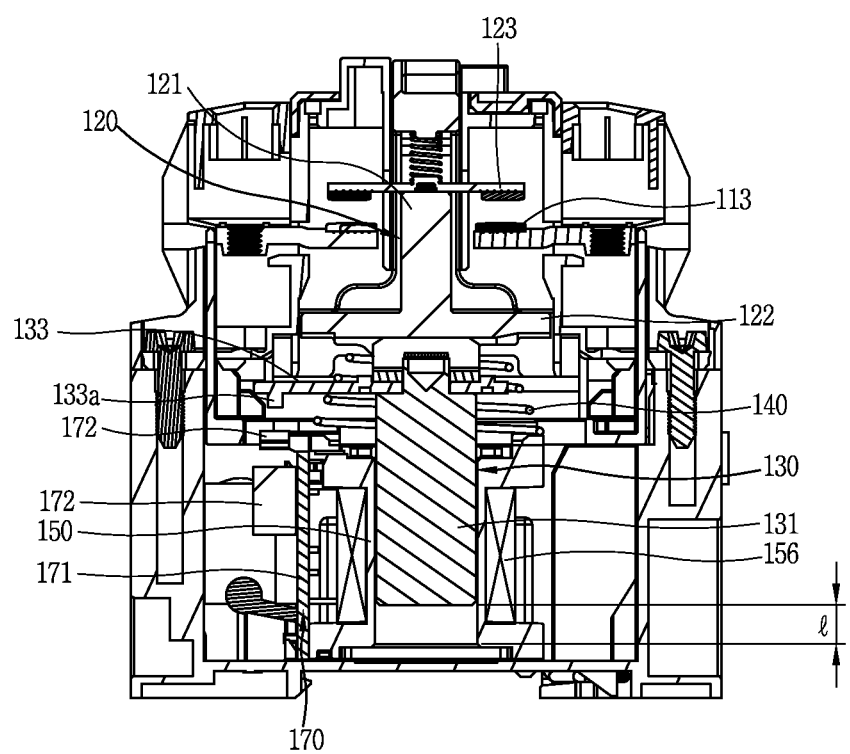
FIG. 22 is a cross-sectional view illustrating a state before a magnetic contactor according to an embodiment of the present invention operates.
Figure 23:
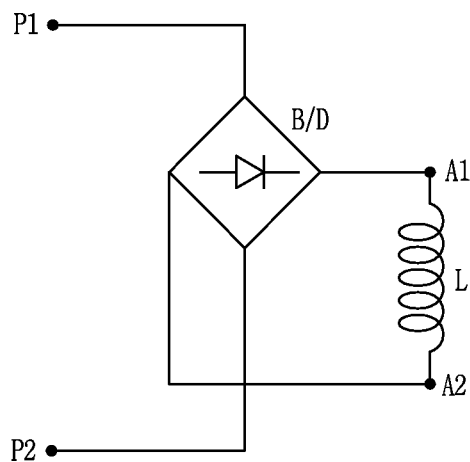
FIG. 23 is a circuit diagram illustrating a state in which external power is applied to a coil through an inverting switch, according to an embodiment of the present invention.

FIG. 22 is a cross-sectional view illustrating a state before a magnetic contactor according to an embodiment of the present invention operates, and FIG. 23 is a circuit diagram illustrating a state in which external power is applied to the coil 156 through the inverting switch 172, according to an embodiment of the present invention.

A circuit operating state of the manipulating circuit part 170 based on the above-described circuit structure will now be described.

As illustrated in FIG. 22, the movable contact 123 and the fixed contact 113 which are disposed in the first frame 111 may be separated from each other.

External power may be applied to the coil 156 through the inverting switch 172, for supplying main power to a load. In this case, the distance "l" between the movable core 131 and the yoke 160 is the maximum before the external power is applied to the coil 156, and thus, an absorbing force for attracting the movable core 131 to the yoke 160 to close the movable contact 123 to the fixed contact 113 should be greater than that of a case in which a contact state of a contact part (the movable contact 123 and the fixed contact 113) is maintained.

As illustrated in FIG. 23, when the external power is applied through the coil power input terminals P1 and P2, an input current may pass through the inverting switch SW which normally is in a switch-on state, and then may be converted from an AC current into a DC current by rectifying element B/D (the bridge diode), whereupon the DC current may be applied to the coil L.

Figure 24:
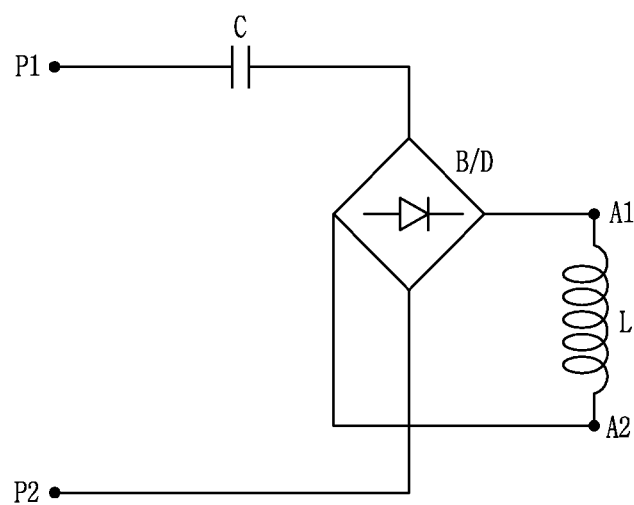
FIG. 24 is a circuit diagram illustrating a state in which the external power is applied to the coil through a capacitor, according to an embodiment of the present invention.
Figure 25:
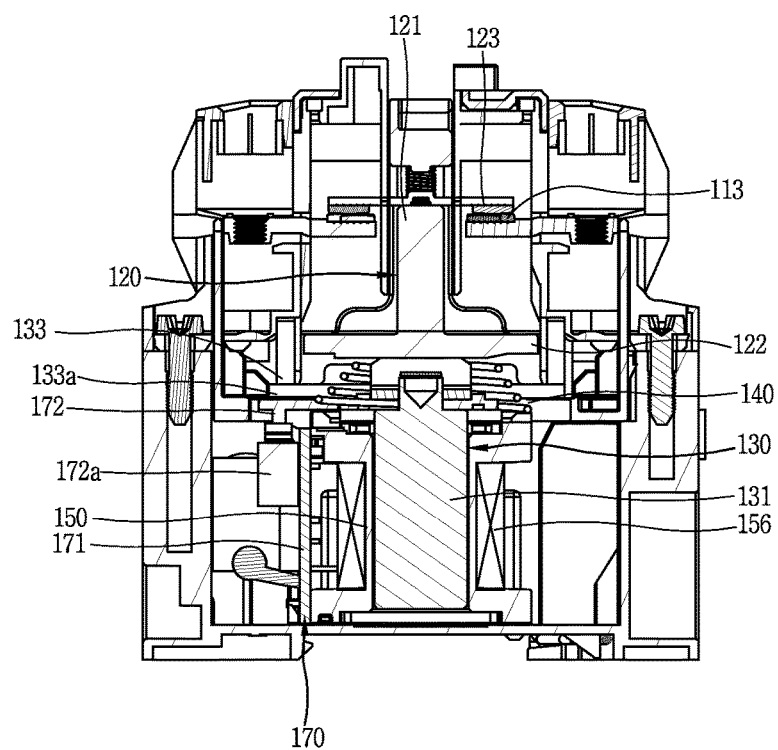
FIG. 25 is a cross-sectional view illustrating a state after the magnetic contactor of FIG. 22 operates.

FIG. 24 is a circuit diagram illustrating a state in which the external power is applied to the coil L through a capacitor C, according to an embodiment of the present invention, and FIG. 25 is a cross-sectional view illustrating a state after the magnetic contactor of FIG. 22 operates.

When an external source current is applied to the coil 156, a magnetic field may be generated around the coil 156, and the yoke 160 which acts as a fixed core may be magnetized by the magnetic field, whereby the fixed part 180 (including the bobbin 150 and the yoke 160) may wholly become an electromagnet. The movable part 130 (the movable core 131 and the connecting member 132) may be lowered toward the yoke 160 of the fixed part 180 by an absorbing force of the magnetized fixed part 180.

Here, when the lower end of the movable core 131 is close to the lower end of the yoke 160, the distance "l" may be reduced, and the magnetic force "F" between the movable core 131 and the yoke 160 may increase (see FIG. 20). Therefore, when the movable contact 123 is closed, an external source current applied to the movable core 131 may decrease, and thus, if the lower end of the lowered movable core 131 being close to the lower end of the yoke 160 is sensed by the inverting switch 172, a voltage applied to the coil 156 may decrease.

Therefore, when the lower end of the movable core 131 is close to the lower end of the yoke 160, the switch manipulating projection 133a of the movable core 131 may press the arc-shaped contact terminal 172a', which is provided at the switch operating lever 172*a* of the inverting switch 172, to switch off (invert) a contact of the inverting switch 172.

As illustrated in FIG. 24, the external source current may flow through the capacitor C simultaneously with the switch-off of the inverting switch SW, and thus, a voltage may be dropped. A dropped current may be rectified by the rectifying element B/D, and then may flow in the coil L.

A magnetic force (an absorbing force) increases due to the reduced distance between the movable core 131 and the yoke 160 to which the magnetic force is applied, and thus, despite that the dropped current flows in the coil 156, a contact may be contacted, the absorbing force of the fixed part 180 for contacting a contact and maintaining a contact state of the contact is sufficient.

As illustrated in FIG. 25, the lower end of the movable core 131 is lowered by the absorbing force generated by the fixed part 180 to contact the lower end of the yoke 160, and the movable contact 123 mechanically connected to the movable core 131 contacts the fixed contact 113, whereby main power is applied to the load.

Therefore, according to embodiments of the present invention, provided can be the magnetic contactor in which a consumption current flowing in the coil 156 (L) is reduced due to a structure of the manipulating circuit part 170 which uses the inverting switch 172 and the voltage dropping element C, and thus, even when the temperature of the coil 156 rises to an allowable limit temperature, a reliability of an operation of the movable contact 123 is secured, and moreover, the coil 156 (L) within the broad rated voltage range is used.

For example, in the prior art low-capacity magnetic contactor, the rated voltage of the coil 156 (L) for operating the movable contact 123 is 48 V. However, in the low-capacity magnetic contactor according to embodiments of the present invention, the rated voltage range of the coil 156 (L) for operating the movable contact 123 is broadened to 44 V to 75 V, and thus, a useful range of a product can be secured broader than that of another product in the same class Moreover, by changing a shape of the movable core 131, a free space is secured in a side space of the bobbin 150. Therefore, even without enlarging a size of the low-capacity magnetic contactor, the manipulating circuit part 170 (a PCB circuit part) is mounted, and moreover, the manipulating circuit part 170 is compactly disposed in a vertical direction at the side of the bobbin 150 so as not to be affected by interference caused by movement of the movable part 130. Accordingly, an internal space of a size-limited product can be broadly used.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A magnetic contactor comprising:
    a frame;
    a bobbin provided in the frame, and configured to include a hollow part, wherein a coil is wound around an outer surface of the bobbin;
    a movable core movably inserted into the hollow part in an axial direction;
    a yoke disposed at the outer surface of the bobbin to be separated from the coil and to face each other, and configured to act as a fixed core; and
    a manipulating circuit part disposed at the outer surface of the bobbin in parallel with a moving direction of the movable core to intersect the yoke,
    wherein the manipulating circuit part comprises:
    a printed circuit board (PCB);
    an inverting switch provided on the PCB, wherein the inverting switch is switched on or off on the contrary to a contact of a main circuit; and
    a voltage dropping element provided on the PCB, wherein when the inverting switch is inverted, the voltage dropping element drops an external voltage applied thereto to reduce a voltage applied to a coil.

2. The magnetic contactor of claim 1, wherein the movable core has a cylindrical shape.

3. The magnetic contactor of claim 1, wherein the yoke is detachably coupled to a side of the bobbin.

4. The magnetic contactor of claim 1, wherein the yoke comprises first and second yokes provided to be separable from and contactable with each other, each of the first and second yokes comprising:
    a plurality of contacts disposed to be separated from each other in an axial direction of the bobbin and to face each other on the same plane; and
    a connecting part disposed in parallel with a moving direction of the bobbin to connect ends of the plurality of contacts.

5. The magnetic contactor of claim 1, wherein the voltage dropping element is a capacitor.

6. The magnetic contactor of claim 1, wherein the manipulating circuit part further comprises a rectifying element configured to convert external AC power into DC power.

7. The magnetic contactor of claim 6, wherein the inverting switch is disposed between the coil power input terminal and the rectifying element.

8. The magnetic contactor of claim 1, wherein the bobbin comprises a plurality of yoke inserting parts respectively disposed at both ends of a bobbin body to be separated from each other in the moving direction of the movable core, and configured to guide insertion of the yoke.

9. The magnetic contactor of claim 1, wherein the inverting switch is mounted on the manipulating circuit part as one body, and modularized.

10. The magnetic contactor of claim 1, wherein,
    the frame comprises a holder movably provided in the frame, and configured to include a support guide part and support the movable core, and
    the movable core comprises:
    a connecting member coupled to one end of the movable core; and
    a support provided at the connecting member, configured to include a plurality of sliding projections which are respectively formed to protrude toward each other at both sides, and sliding-coupled to the support guide part.

11. A magnetic contactor comprising:
a frame;
a bobbin provided in the frame, and configured to include a hollow part, wherein a coil is wound around an outer surface of the bobbin;
a movable core movably inserted into the hollow part in an axial direction;
a yoke disposed at the outer surface of the bobbin to be separated from the coil and to face each other, and configured to act as a fixed core; and
a manipulating circuit part disposed at the outer surface of the bobbin in parallel with a moving direction of the movable core to intersect the yoke, wherein the yoke comprises first and second yokes provided to be separable from and contactable with each other, each of the first and second yokes comprising:
a plurality of contacts disposed to be separated from each other in an axial direction of the bobbin and to face each other on the same plane; and
a connecting part disposed in parallel with a moving direction of the bobbin to connect ends of the plurality of contacts, wherein in each of the first and second yokes,
a semicircular opening is formed at one of the plurality of contacts, and insertion of the movable core into the semicircular opening is allowed, and
the other contact is formed in a closed structure to stop movement of the movable core.

12. A magnetic contactor comprising:
a frame;
a bobbin provided in the frame, and configured to include a hollow part, wherein a coil is wound around an outer surface of the bobbin;
a movable core movably inserted into the hollow part in an axial direction;
a yoke disposed at the outer surface of the bobbin to be separated from the coil and to face each other, and configured to act as a fixed core; and
a manipulating circuit part disposed at the outer surface of the bobbin in parallel with a moving direction of the movable core to intersect the yoke wherein,
the frame comprises a holder movably provided in the frame, and configured to include a support guide part and support the movable core, and
the movable core comprises:
a connecting member coupled to one end of the movable core;
a support provided at the connecting member, and configured to include an inserting hole which is formed at each of both sides; and
a supporting pin assembled to pass through the inserting hole, and slidably inserted into and coupled to an inner surface of the support guide part.

13. A magnetic contactor comprising:
a frame;
a bobbin provided in the frame, and configured to include a hollow part, wherein a coil is wound around an outer surface of the bobbin;
a movable core movably inserted into the hollow part in an axial direction;
a yoke disposed at the outer surface of the bobbin to be separated from the coil and to face each other, and configured to act as a fixed core; and
a manipulating circuit part disposed at the outer surface of the bobbin in parallel with a moving direction of the movable core to intersect the yoke, wherein the bobbin comprises:
a coil power input terminal configured to be input an external power; and
a coil power input member configured to connect the coil power input terminal to the manipulating circuit part to apply the external power to the manipulating circuit part.

* * * * *